(12) United States Patent
Nakagawa

(10) Patent No.: US 7,425,393 B2
(45) Date of Patent: Sep. 16, 2008

(54) PHASE SHIFT PHOTOMASK AND METHOD FOR IMPROVING PRINTABILITY OF A STRUCTURE ON A WAFER

(75) Inventor: Kent Nakagawa, Beaverton, OR (US)

(73) Assignee: Toppan Photomasks, Inc., Round Rock, TX (US)

( * ) Notice: Subject to any disclaimer, the term of this patent is extended or adjusted under 35 U.S.C. 154(b) by 205 days.

(21) Appl. No.: 11/383,378

(22) Filed: May 15, 2006

(65) Prior Publication Data

US 2006/0199109 A1    Sep. 7, 2006

Related U.S. Application Data

(63) Continuation of application No. PCT/US2004/038900, filed on Nov. 17, 2004.

(60) Provisional application No. 60/566,733, filed on Apr. 30, 2004, provisional application No. 60/520,809, filed on Nov. 17, 2003.

(51) Int. Cl.
    *G03F 1/00* (2006.01)
(52) U.S. Cl. ......................................... 430/5
(58) Field of Classification Search ............... 430/5, 430/322–324, 394
    See application file for complete search history.

(56) References Cited

U.S. PATENT DOCUMENTS

| | | | |
|---|---|---|---|
| 5,428,478 A | 6/1995 | Hanyu et al. | 359/565 |
| 5,573,890 A | 11/1996 | Spence | 430/311 |
| 5,620,816 A | 4/1997 | Dao | 430/5 |
| 5,807,649 A | 9/1998 | Liebmann et al. | 430/5 |
| 5,882,827 A | 3/1999 | Nakao | 430/5 |
| 5,935,740 A | 8/1999 | Pierrat | 430/5 |
| 5,958,630 A | 9/1999 | Hashimoto et al. | 430/5 |
| 6,042,998 A | 3/2000 | Brueck et al. | 430/316 |
| 6,057,063 A | 5/2000 | Liebmann et al. | 430/5 |
| 6,251,549 B1 | 6/2001 | Levenson | 430/11 |
| 6,841,801 B2 * | 1/2005 | Kim et al. | 430/5 |
| 2002/0058188 A1 | 5/2002 | Iwasaki et al. | 430/5 |
| 2002/0094492 A1 | 7/2002 | Randall et al. | 430/311 |

FOREIGN PATENT DOCUMENTS

CN    1400630    3/2003

OTHER PUBLICATIONS

International Preliminary Report and Written Opinion; PCT/US2004/038900; pp. 6, mailed Jun. 1, 2006.
PCT Transmittal of International Search report and Written Opinion for PCT/US04/38900, 9 pgs, mailed Dec. 19, 2005.

* cited by examiner

*Primary Examiner*—Stephen Rosasco
(74) *Attorney, Agent, or Firm*—Baker Botts L.L.P.

(57) ABSTRACT

A phase shift photomask and method for improving printability of a structure on a wafer are disclosed. The method includes providing a photomask including a zero degree PSW formed on a top surface of a substrate and a 180 degree PSW formed in a first region of the substrate. An orthogonal PSW that facilitates projection of an increased intensity of radiant energy through a second region of the substrate during a lithography process is formed in the second region between the zero degree PSW and the 180 degree PSW.

23 Claims, 3 Drawing Sheets

US 7,425,393 B2

PHASE SHIFT PHOTOMASK AND METHOD FOR IMPROVING PRINTABILITY OF A STRUCTURE ON A WAFER

RELATED APPLICATION

This application is a Continuation of International Patent Application No. PCT/US2004/038900 entitled "PHASE SHIFT PHOTOMASK AND METHOD FOR IMPROVING PRINTABILITY OF A STRUCTURE ON A WAFER" filed Nov. 17, 2004, which claims the benefit of U.S. Provisional Patent Application Ser. No. 60/520,809 entitled "PHASE SHIFT PHOTOMASK AND METHOD FOR IMPROVING PRINTABILITY OF A STRUCTURE ON A WAFER" filed by Kent Nakagawa on Nov. 17, 2003.

This application also claims the benefit of U.S. Provisional Patent Application Ser. No. 60/566,733 entitled "PHASE SHIFT PHOTOMASK AND METHOD FOR IMPROVING PRINTABILITY OF A STRUCTURE ON A WAFER" filed by Kent Nakagawa on Apr. 30, 2004.

TECHNICAL FIELD OF THE INVENTION

The present invention relates in general to photolithography and, more particularly to a phase shift photomask and method for improving printability of a structure on a wafer.

BACKGROUND OF THE INVENTION

As device manufacturers continue to produce smaller devices, the requirements for photomasks used in the fabrication of these devices continue to tighten. Photomasks, also known as reticles or masks, typically consist of substrates that have a patterned layer formed on the substrate. The absorber layer includes a pattern representing an image that may be transferred onto a wafer in a lithography system. As feature sizes of devices decrease, the corresponding patterns on the photomask also become smaller and more complex. Consequently, the quality of the mask has become one of the most crucial elements in establishing a robust and reliable fabrication process.

Some applications may require the use of near-wavelength structures in addition to sub-wavelength line structures. Traditionally, the sub-wavelength line structures may be fabricated using an alternating aperture phase shift mask (AAPSM). The AAPSM typically includes etched areas of the substrate that provide destructive interference, which allows lines smaller than the wavelength of light used in the lithography system to be printed on the wafer. Near-wavelength structures, however, typically are formed using a binary photomask. In some applications, such as high capacity hard disk drives, the photomask may include sub-wavelength AAPSM areas located adjacent to, or directly linked to near-wavelength areas. At the junction of the near-wavelength structure and the sub-wavelength line structure, the curvature of the feature edge may be exaggerated due to the transition between the sub-wavelength AAPSM areas and the near-wavelength AAPSM areas.

Previous techniques for reducing the curvature of a feature edge include applying optical proximity correction (OPC) or geometrically modifying etched and non-etched areas of the substrate. These techniques, however, have minimal impact on reducing the curvature of the features edges. Another technique for correcting the curvature of the feature edges includes increasing the amount of light at the point where the near-wavelength structure meets the sub-wavelength line structure through the use of intensity-attenuated, non-opaque material. This technique, however, impacts the phase-shifting nature of the etched and non-etched areas, which may reduce the quality of the sub-wavelength line structure.

SUMMARY OF THE INVENTION

In accordance with teachings of the present invention, disadvantages and problems associated with printing a structure on a wafer have been substantially reduced or eliminated. In a particular embodiment, an orthogonal phase shift window (PSW) formed in a substrate between a zero degree PSW and a 180 degree PSW provides increased intensity during a lithography process.

In accordance with one embodiment of the present invention, a method for improving printability of a structure on a wafer includes providing a photomask including a zero degree PSW formed on a top surface of a substrate and a 180 degree PSW formed in a first region of the substrate. An orthogonal PSW that facilitates projection of an increased intensity of radiant energy through a second region of the substrate during a lithography process is formed in the second region between the zero degree PSW and the 180 degree PSW.

In accordance with another embodiment of the present invention, a method for improving printability of a structure on a wafer includes forming a patterned layer on at least a portion of a substrate and forming a zero degree PSW in the patterned layer to expose a top surface of the substrate. A 180 degree PSW is formed in a first exposed region of the substrate and an orthogonal PSW that facilitates projection of an increased intensity of radiant energy through a second exposed region of the substrate during a lithography process is formed in the second region between the zero degree PSW and the 180 degree PSW.

In accordance with a further embodiment of the present invention, a photomask for improving printability of a structure on a wafer includes a zero degree PSW formed on a top surface of a substrate. A 180 degree PSW is formed by a first trench in the substrate and an orthogonal PSW that facilitates projection of an increased intensity of radiant energy through a second region of the substrate during a lithography process is formed by a second trench between the zero degree PSW and the 180 degree PSW.

In accordance with an additional embodiment of the present invention, a photomask for improving printability of a structure on a wafer includes a patterned layer formed on at least a portion of a substrate and a zero degree PSW formed in the patterned layer to expose a top surface of the substrate. A 180 degree PSW is formed by a first trench in the substrate such that the zero degree PSW and the 180 degree PSW cooperate to form at least one edge of a sub-wavelength feature. A near-wavelength feature is formed in the patterned layer adjacent the sub-wavelength feature. An orthogonal PSW is formed by a second trench in the substrate between the zero degree PSW and the 180 degree PSW that extends into a portion of the sub-wavelength feature and a portion of the near-wavelength feature. The orthogonal PSW facilitates projection of an increased intensity of radiant energy through the second region of the substrate during a lithography process.

Important technical advantages of certain embodiments of the present invention include an orthogonal PSW that facilitates fabrication of a near-wavelength feature and a sub-wavelength feature with a single photomask. The orthogonal PSW functions to increase intensity of the radiant energy projected onto the surface of the wafer in a region corresponding to the orthogonal PSW. The increased intensity provides a desired curvature at the junction of a near-wavelength structure and a sub-wavelength structure and eliminates the need to use separate photomasks to create the two structures. Additionally, the orthogonal PSW allows for the imaging of the structures in a single exposure.

Another technical advantage of certain embodiments of the present invention includes an orthogonal PSW that eliminates extreme curvature that may occur when a near-wavelength feature located adjacent a sub-wavelength feature are imaged onto the surface of a wafer. In order to correct the curvature at the junction of the near-wavelength and sub-wavelength structures imaged on the wafer, the amount of light projected through the photomask onto the wafer at the junction should be increased. The orthogonal PSW is designed to be approximately orthogonal with a zero degree PSW and a 180 degree PSW that form at least a portion of the sub-wavelength feature on the photomask. The orthogonal PSW functions to provide increased intensity of light at the junction of the structures without distorting the printing of the sub-wavelength structure or the placement of the angled portion of the near-wavelength structure because the orthogonal PSW does not contribute to the phase-shifting characteristics of the zero degree PSW and the 180 degree PSW.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 6, where like numbers are used to indicate like and corresponding parts.

Figure 1:
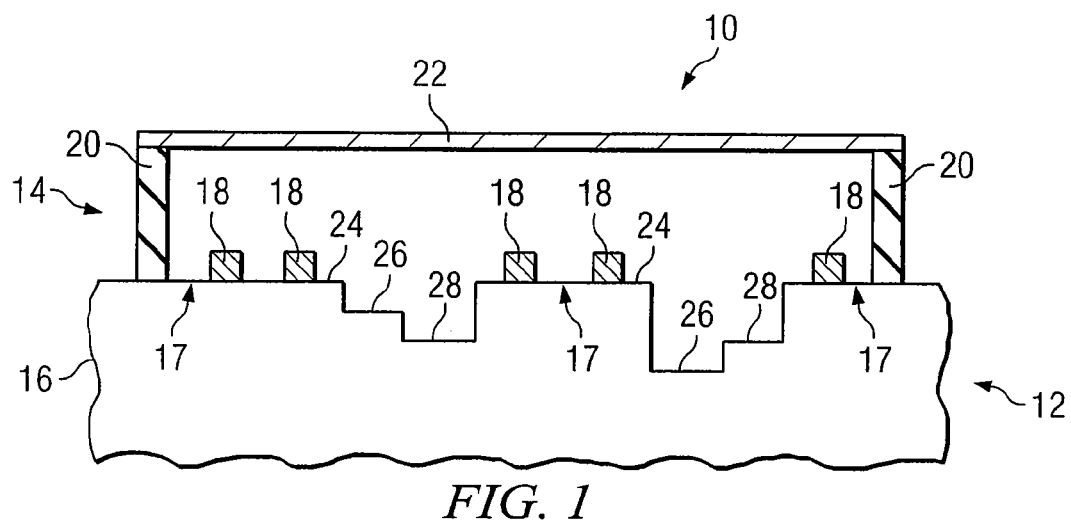
FIG. 1 illustrates a cross-sectional view of a photomask assembly according to teachings of the present invention.

FIG. 1 illustrates a cross-sectional view of an example photomask assembly 10. Photomask assembly 10 includes pellicle assembly 14 mounted on photomask 12. Substrate 16, patterned layer 18, zero degree phase shift window (PSW) 24, orthogonal PSW 26 and 180 degree PSW 28 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM) (e.g., an alternating aperture phase shift mask, also known as a Levenson type mask), an optical proximity correction (OPC) mask or any other type of mask suitable for use in a lithography system.

Photomask 12 includes patterned layer 18 formed on top surface 17 of substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (e.g., MOCN, where M is selected from the group consisting of chromium, cobalt, iron, zinc, molybdenum, niobium, tantalum, titanium, tungsten, aluminum, magnesium, and silicon), or any other suitable material that absorbs electromagnetic energy with wavelengths in the ultraviolet (UV) range, deep ultraviolet (DUV) range, vacuum ultraviolet (VU) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. In one embodiment, the mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer. In some embodiments, the mask pattern file may include more than one layer of the integrated circuit such that a photomask may be used to image features from more than one layer onto the surface of a semiconductor wafer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

In the illustrated embodiment, photomask 12 further includes zero degree PSW 24, orthogonal PSW 26 and 180 degree PSW 28. Orthogonal PSW 26 and 180 degree PSW 28 may be trenches formed in substrate 16. The combination of zero degree PSW 24 and 180 degree PSW 28 may provide a phase shift of approximately 180° such that radiant energy passing through 180 degree PSW 28 is approximately 180° out of phase with the radiant energy passing through zero degree PSW 24 when photomask assembly 10 is used in a lithography system. The 180° phase shift between zero degree PSW 24 and 180 degree PSW 28 produces destructive interference that creates a dark or opaque area in a resist layer formed on a wafer. This dark area corresponds to a portion of the resist layer that is not exposed to the radiant energy such that during a develop process, the resist is not removed from the dark area.

Orthogonal PSW 26 may be substantially orthogonal to both zero degree PSW 24 and 180 degree PSW 28 such that it does not contribute to or negatively interact with the phase shift produced by zero degree PSW 24 and 180 degree PSW 28. In the illustrated embodiment, the depth of orthogonal PSW 26 may be approximately half the depth of 180 degree PSW 28 such that the phase shift with respect to zero degree PSW 24 and 180 degree PSW 28 is approximately 90°. In another embodiment, the depth of orthogonal PSW 26 may be approximately fifty percent (50%) larger than the depth of 180 degree PSW 28 such that the phase shift with respect to zero degree PSW 24 is approximately 270° and the phase shift with respect to 180 degree window 28 is approximately 90°.

Zero degree PSW 24 may be formed by etching patterned layer 18 to expose top surface 17 of substrate 16, and orthogonal PSW 26 and 180 degree PSW 28 may be formed by etching substrate 16 to create trenches that have a depth appropriate to create the desired phase shift at one or more exposure wavelengths.

During a lithography process, orthogonal PSW 26 may increase the intensity of the radiant energy projected onto the wafer in regions corresponding to the area of orthogonal PSW 26. The increased intensity may produce the desired cornering effect without affecting the 180° phase shift needed to produce the desired line width. In one embodiment, orthogonal PSW 26 may be formed in substrate 16 in the same photomask fabrication process as zero degree PSW 24 and 180 degree PSW 28. In another embodiment, orthogonal PSW 26 may be formed in a separate manufacturing process such that photomask 12 initially includes zero degree PSW 24 and 180 degree PSW 28, and is then altered to include orthogonal PSW 26.

In one embodiment, orthogonal PSW 26 may be formed in photomask 12 for use in imaging structures for hard disk drive read/write heads. In other embodiments, orthogonal PSW 26 may be used in any design that benefits from having a substantially accurate corner junction between a structure having a width significantly less than the exposure wavelength of the lithography system (e.g., a sub-wavelength structure) and a structure having a width greater than or equal to the exposure wavelength of the lithography system (e.g., a near wavelength structure). This type of design may be used to create integrated circuits that have specific performance, spacing or timing requirements.

Figure 2:
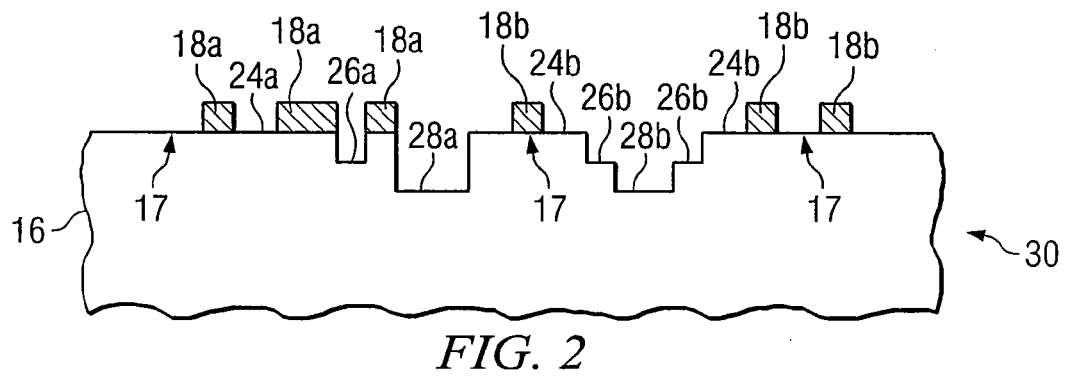
FIG. 2 illustrates a cross-sectional view of an example embodiment of a photomask according to teachings of the present invention.

FIG. 2 illustrates a cross-sectional view of an example embodiment of a photomask that includes an orthogonal PSW. In the illustrated embodiment, photomask 30 includes substrate 16, patterned layers 18a and 18b (generally referred to as patterned layer 18) formed on top surface 17, zero degree PSWs 24a and 24b (generally referred to as zero degree PSW 24), orthogonal PSWs 26a and 26b (generally referred to as orthogonal PSW 26) and 180 degree PSWs 28a and 28b (generally referred to as 180 degree PSW 28).

As shown, zero degree PSW 24a may be formed by etching patterned layer 18a to expose top surface 17 of substrate 16. Orthogonal PSW 26a may be formed by etching substrate 16 to create a trench in substrate 16 having a depth that produces a phase shift of approximately 90° relative to zero degree PSW 24a at the exposure wavelength of a lithography system when photomask 30 is used to project an image on to the surface of a wafer. In another embodiment, the trench forming orthogonal PSW 26a may have a depth that produces a phase shift of approximately 270° relative to zero degree PSW 24a at the exposure wavelength. Orthogonal PSW 26a may be located adjacent to zero degree PSW 24a and patterned layer 18a may separate the windows.

180 degree PSW 28a may be formed by etching substrate 16 to create a trench in substrate 16 having a depth that produces a phase shift of approximately 180° relative to zero degree PSW 24a at the exposure wavelength of a lithography system. 180 degree PSW 28a may be adjacent to orthogonal PSW 24a and patterned layer 18a may separate the two widows. Zero degree PSW 24a and 180 degree PSW 28a may cooperate to form a sub-wavelength feature to be imaged as a sub-wavelength structure on the surface of a wafer during a lithography process. As described above in reference to FIG. 1, orthogonal PSW 26 functions to produce the desired curvature at the junction of a sub-wavelength line structure and a near-wavelength structure by increasing the intensity of the radiant energy projected on a wafer in a region that corresponds to the window.

Photomask 30 may also include zero degree PSW 24b, orthogonal PSW 26b and 180 degree PSW 28b. As shown, 180 degree PSW 28b may be formed in substrate 16 directly adjacent to orthogonal PSW 26b. Additionally, orthogonal PSW 26b may be formed directly adjacent to zero degree PSW 24b. In other embodiments, patterned layer 18b may separate at least one of zero degree PSW 24b, orthogonal PSW 26b and 180 degree PSW 28b. Although photomask 30 is illustrated as including specific patterns using zero degree PSW 24, orthogonal PSW 26 and 180 degree PSW 28, any pattern may be formed by placing an orthogonal PSW between a zero degree PSW and a 180 degree PSW. Additionally, photomask 30 may be comparable in size, shape, and type to photomask 12 as described in FIG. 1.

Figure 3:
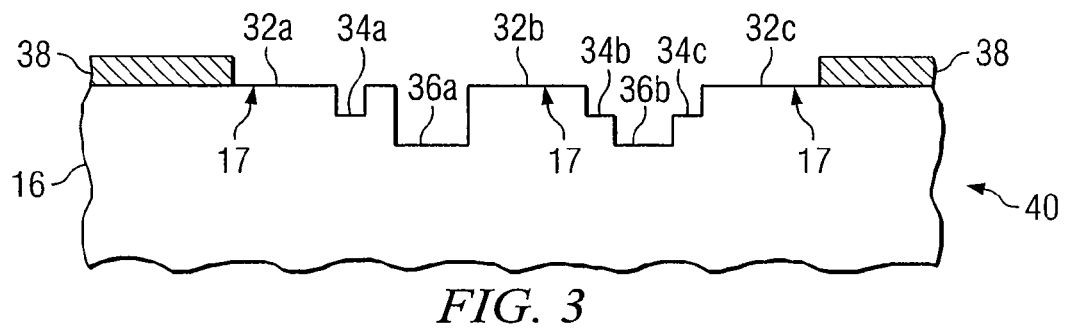
FIG. 3 illustrates a cross-sectional view of another example embodiment of a photomask according to teachings of the present invention.

FIG. 3 illustrates a cross-sectional view of another example embodiment of a photomask that includes an orthogonal PSW. In the illustrated embodiment, photomask 40 includes substrate 16, zero degree PSWs 32a, 32b and 32c (generally referred to as zero degree PSW 32), orthogonal PSWs 34a, 34b and 34c (generally referred to as orthogonal PSW 34) and 180 degree PSWs 36a and 36b (generally referred to as 180 degree PSW 36). In the illustrated embodiment, photomask 40 is a chromeless photomask for use in chromeless phase lithography (CPL). Photomask 40 may include absorber layer 38 formed on portions of top surface 17 of substrate 16 outside the mask field to prevent the transfer of images onto a surface. Materials used to form absorber layer 38 may be comparable to those used to form patterned layer 18 as described in FIG. 1. In another embodiment, top surface 17 of substrate 16 may be free of any absorber material.

Zero degree PSW 32 may be formed by exposing a layer of photoresist (not expressly shown), developing the photoresist to form a pattern and etching absorber layer 38 to expose top surface 17 of substrate 16. Another layer of photoresist (not expressly shown) may be formed on zero degree PSW 32 and any remaining absorber layer 38. In one embodiment, a pattern including orthogonal PSW 34 and 180 degree PSW 36 may be formed in the photoresist layer by exposing the photoresist and developing the photoresist to expose top surface 17 of substrate 16. The exposed areas of substrate 16 may be etched to create a trench in substrate 16 having a depth that produces a phase shift of approximately 90° relative to zero degree PSW 32 at the exposure wavelength of a lithography system when photomask 40 is used to project an image on to the surface of a wafer. 180 degree PSW 36 may be formed by depositing a layer of photoresist (not expressly shown) on zero degree PSW 32, the trenches formed by the first etching process and any remaining absorber layer 38. The photoresist may be exposed and developed to expose portions of the trenches that correspond to 180 degree PSW 36. The exposed portions of the trenches may then be etched further to create a trench having a depth that produces a phase shift of approximately 180° relative to zero degree PSW 32 at one or more exposure wavelengths.

In other embodiments, orthogonal PSW 34 may be formed by depositing a layer of photoresist (not expressly shown) on zero degree PSW 32, the trenches formed by the first and second etching processes and any remaining absorber layer 38. The photoresist may be exposed and developed to expose portions of the trenches that correspond to orthogonal PSW 34. The exposed portions of the trenches may then be etched further to create a trench having a depth that produces a phase shift of approximately 270° relative to zero degree PSW 32 at one or more exposure wavelengths.

Orthogonal PSW 34 and 180 degree PSW 36 may also be formed in separate steps. For example, orthogonal PSW 34 may be formed by depositing a layer of photoresist on exposed portions of substrate 16 and any remaining absorber layer 38 and exposing the photoresist only in areas that correspond to orthogonal PSW 34. The exposed areas may then be etched to create a trench having a depth that produces a phase shift of approximately 90° relative to zero degree PSW 32 at one or more exposure wavelengths. 180 degree PSW 36 may then be formed by depositing a layer of photoresist on exposed portions of substrate 16 (e.g., including the trenches that form orthogonal PSW 34) and exposing the photoresist only in areas that correspond to 180 degree PSW 36. The photoresist may be developed to expose top surface 17 of substrate 16 and then substrate 16 may be etched to create a trench having a depth that produces a phase shift of approximately 180° at one or more exposure wavelengths.

As illustrated, zero degree PSW 32a may be directly adjacent to orthogonal PSW 34a and 180 degree PSW 36a may be separated from orthogonal PSW 34a by a small portion of unetched substrate. As described above in reference to FIG. 1, orthogonal PSW 34 may function to increase the intensity of the radiant energy projected onto the surface of a wafer (not expressly shown) in a region that corresponds to the window. The increased intensity may create the desired curvature at the junction of a sub-wavelength line structure and a near-wavelength line structure on the wafer.

Photomask 40 may also include zero degree PSWs 32b and 32c, orthogonal PSWs 34b and 34c and 180 degree PSW 36b. As shown, 180 degree PSW 36b may be formed in substrate 16 directly adjacent to orthogonal PSWs 34b and 34c. Additionally, orthogonal PSW 34b may be formed directly adjacent to zero degree PSW 32b and orthogonal PSW 34c may be formed directly adjacent to zero degree PSW 32c. In other embodiments, any desirable pattern may be formed by forming an orthogonal PSW between a zero degree PSW and a 180 degree PSW. Photomask 40 may be comparable in size, shape, and type to photomask 12 as described in FIG. 1.

Figure 4:
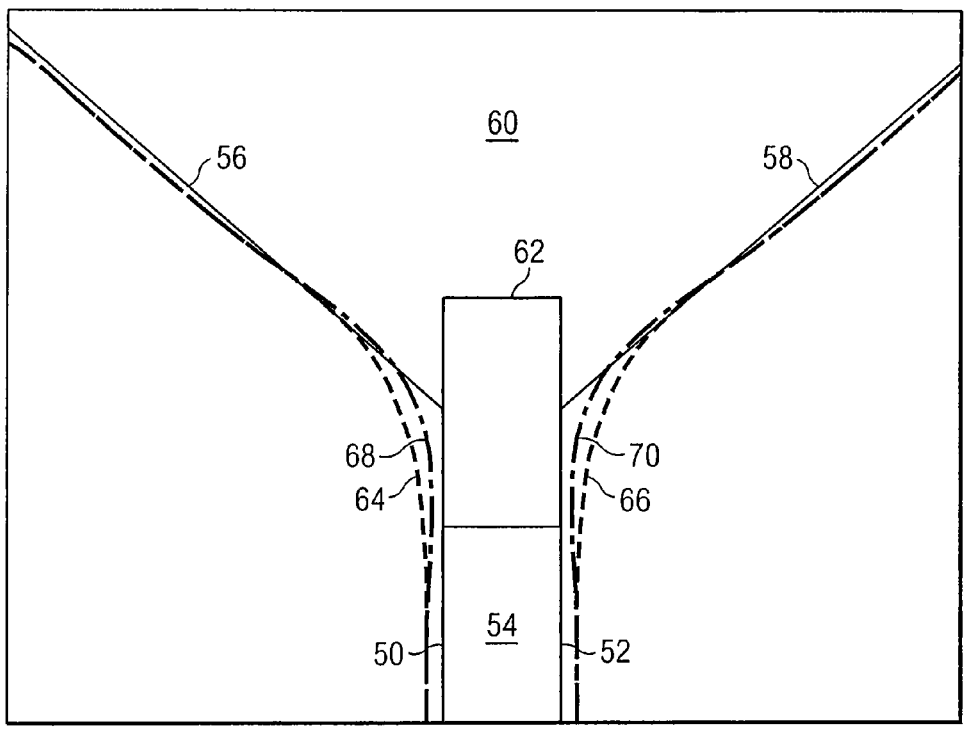
FIG. 4 illustrates a graphical representation of a manufacturability simulation performed using an orthogonal phase shift window (PSW) according to teachings of the present invention.

FIG. 4 illustrates a graphical representation of a manufacturability simulation performed using one example embodiment of an orthogonal PSW. In the results of the simulation, line 50 represents the edge of a zero degree PSW as formed on a photomask and line 52 represents the edge of a 180 degree PSW as formed on the photomask. The long, thin area between lines 50 and 52 represents sub-wavelength feature 54 that is formed on the photomask and may be imaged onto a surface of a wafer to form a sub-wavelength structure. In one embodiment, the width of sub-wavelength feature 54 may be approximately 100 nanometers. In another embodiment, the width of sub-wavelength feature 54 may be less than the exposure wavelength of a lithography system. The wide, triangular region located between line 56 and line 58 represents near-wavelength feature 60 that is formed on the photomask and may be imaged onto the surface of the wafer to form a near-wavelength structure.

Rectangle 62 represents an orthogonal PSW that is formed in the substrate of the photomask. In one embodiment, the orthogonal PSW may have a length of approximately 200 nanometers and a width of approximately 100 nanometers. In another embodiment, the orthogonal PSW may have a width approximately equal to the width of sub-wavelength feature 54. In a further embodiment, the orthogonal PSW may be a square having sides approximately equal to the width of sub-wavelength feature 54. In additional embodiments, the orthogonal PSW may have a width greater than or less than the width of sub-wavelength feature 54. In the illustrated embodiment, the orthogonal PSW may be symmetrically placed between near-wavelength feature 60 and sub-wavelength feature 54. In other embodiments, the orthogonal PSW may be located such that a greater amount extends into near-wavelength feature 60 or a greater amount extends into sub-wavelength feature 54.

Lines 64 and 66 represent how a near-wavelength structure corresponding to near-wavelength feature 60 and a sub-wavelength structure corresponding to sub-wavelength feature 54 would be imaged onto the surface of the wafer without the use of the orthogonal PSW. As shown, the curve representing the junction between sub-wavelength feature 54 and near-wavelength feature 60 is distorted such that the angle created with respect to horizontal is greater than the target angle specified for the junction between the features. Lines 68 and 70 represent how the near-wavelength structure and the sub-wavelength line structure would be imaged onto the surface of the wafer by using the orthogonal PSW. As shown, the angle with respect to horizontal is reduced and the structure imaged onto the wafer more accurately represents the desired structure. In one embodiment, the orthogonal PSW may be used to print a near-wavelength structure having an angle with respect to horizontal of approximately zero degrees to approximately ninety degrees.

Figure 5:
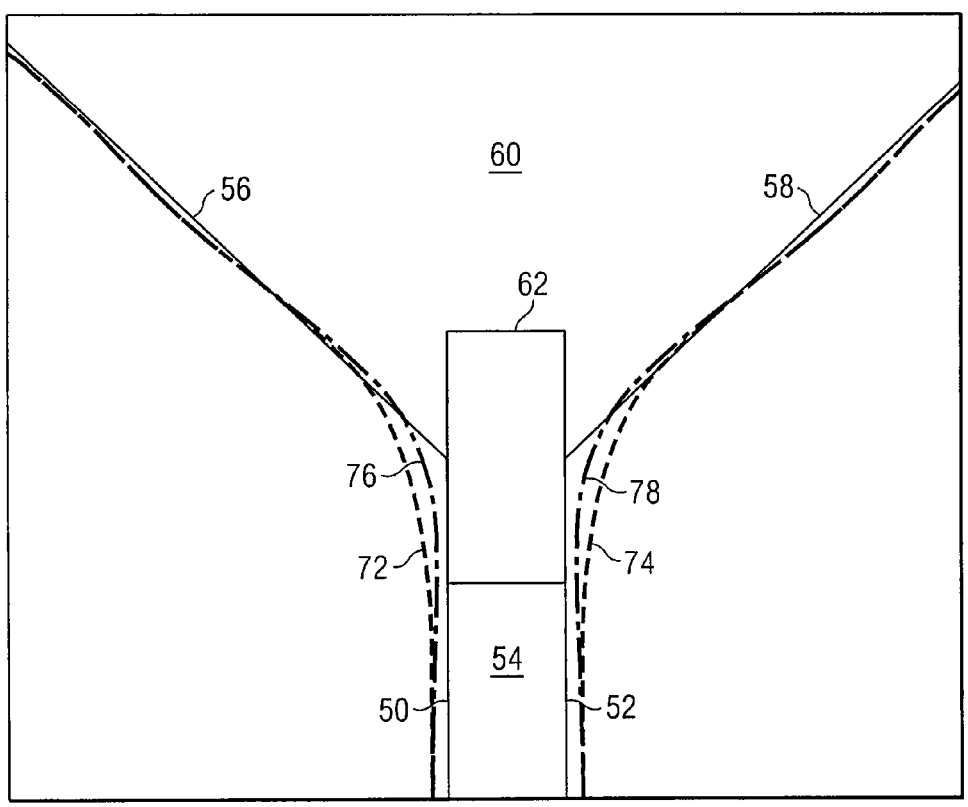
FIG. 5 illustrates a graphical representation of a manufacture ability simulation performed using an orthogonal PSW at one exposure wavelength according to teachings of the present invention.

FIG. 5 illustrates a graphical representation of a simulation performed using an orthogonal PSW at an exposure wavelength of 248 nanometers. As shown, lines 72 and 74 represent the near-wavelength and sub-wavelength line structures as printed on a wafer without using an orthogonal PSW (e.g., rectangle 62) at an exposure wavelength of 248 nm. Lines 76 and 78 represent how the near-wavelength structure and the sub-wavelength line structure would be imaged onto the surface of the wafer by using the orthogonal PSW. As illustrated, the angle with respect to horizontal of lines 76 and 78 is reduced when the orthogonal PSW is included on the photomask such that the curvature imaged on the wafer is closer to the desired curvature (e.g., as shown by the intersection of lines 50 and 56 and the intersection of lines 52 and 58).

Figure 6:
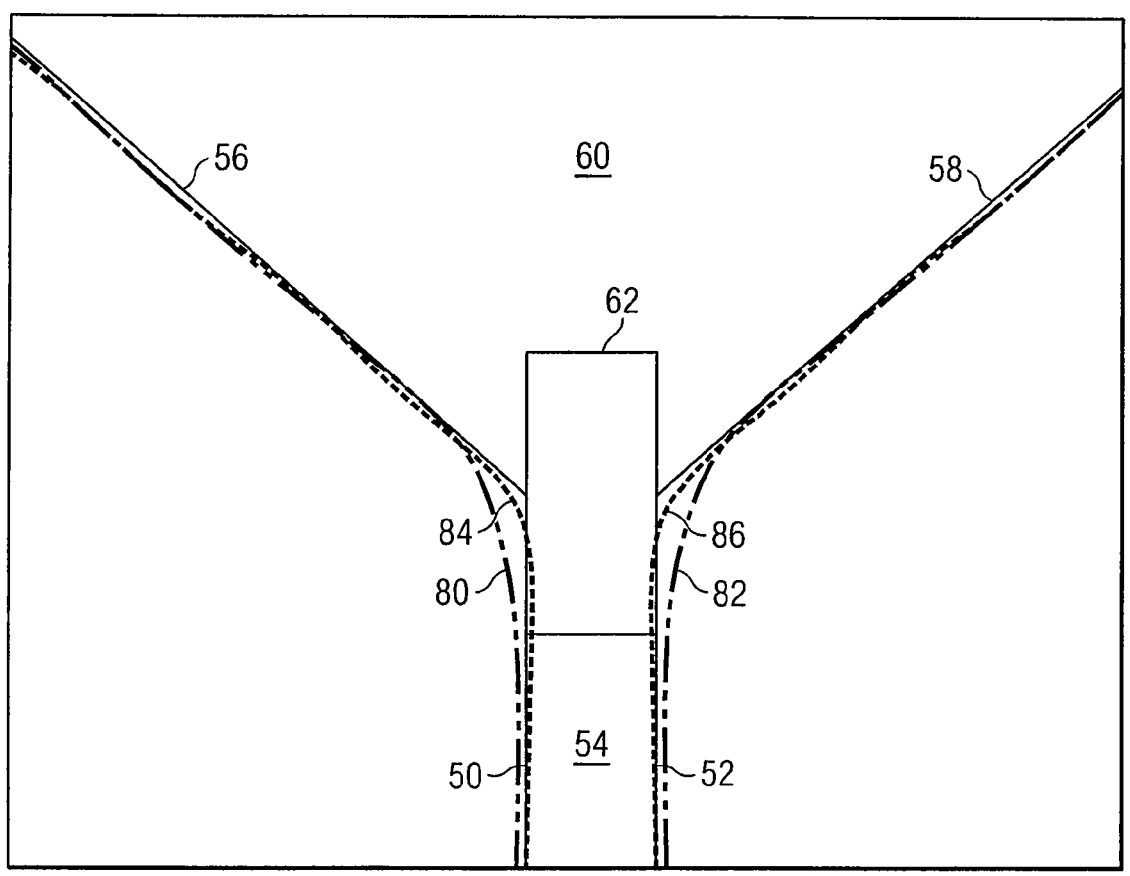
FIG. 6 illustrates a graphical representation of a manufacturability simulation performed using an orthogonal PSW at another exposure wavelength according to teachings of the present invention.

FIG. 6 illustrates a graphical representation of a simulation performed using an orthogonal PSW at an exposure wavelength of 193 nanometers. As shown, lines 80 and 82 represent the near-wavelength and sub-wavelength line structures as printed on a wafer without using an orthogonal PSW at an exposure wavelength of 193 nm. Lines 84 and 86 represent how the near-wavelength structure and the sub-wavelength line structure would be imaged onto the surface of the wafer by using the orthogonal PSW. As shown, the increased intensity of radiant energy provided on the surface of the wafer in the area corresponding to the orthogonal PSW (e.g., rectangle 62) creates a sharper transition between the near-wavelength and the sub-wavelength structures.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method for improving printability of a structure on a wafer, comprising:
   providing a photomask including a substrate, the photomask further including:
      a zero degree phase shift window (PSW) formed on a top surface of the substrate; and
      a 180 degree PSW formed in a first region of the substrate; and
   etching a second region of the substrate to form a substantially orthogonal PSW between the zero degree PSW and the 180 degree PSW, the orthogonal PSW operable to facilitate projection of an increased intensity of radiant energy through the second region during a lithography process.

2. The method of claim 1, further comprising the zero degree PSW and the 180 degree PSW cooperating to form a sub-wavelength feature.

3. The method of claim 2, further comprising a near-wavelength feature located on the photomask adjacent the sub-wavelength feature.

4. The method of claim 3, further comprising the near-wavelength feature including an angle with respect to horizontal between approximately zero degrees and approximately ninety degrees.

5. The method of claim 3, further comprising the orthogonal PSW extending into a portion of the near-wavelength feature and a portion of the sub-wavelength feature.

6. The method of claim 1, further comprising coupling a pellicle assembly to the substrate.

7. The method of claim 1, further comprising:
   the photomask including a patterned layer formed on at least a portion of the top surface of the substrate; and
   the zero degree PSW formed in the patterned layer to expose the top surface of the substrate.

8. The method of claim 1, further comprising the photomask including the orthogonal PSW used in the lithography process to fabricate a read head or a write head for a hard disk drive.

9. A photomask for improving printability of a structure on a wafer, comprising:
   a zero degree phase shift window (PSW) formed on a top surface of a substrate; and
   a 180 degree PSW formed by a first trench in the substrate; and
   a substantially orthogonal PSW formed by a second trench in the substrate and located between the zero degree PSW and the 180 degree PSW, the orthogonal PSW operable to facilitate projection of an increased intensity of radiant energy through the second region during a lithography process.

10. The photomask of claim 9, further comprising the zero degree PSW and the 180 degree PSW cooperating to form a sub-wavelength feature.

11. The photomask of claim 10, further comprising a near-wavelength feature located on the photomask adjacent the sub-wavelength feature.

12. The photomask of claim 11, further comprising the near-wavelength feature including an angle with respect to horizontal between approximately zero degrees and approximately ninety degrees.

13. The photomask of claim 11, further comprising the orthogonal PSW extending into a portion of the near-wavelength feature and a portion of the sub-wavelength feature.

14. The photomask of claim 11, further comprising:
   the near-wavelength feature operable to facilitate projection of a near-wavelength structure on a wafer during the lithography process;
   the sub-wavelength feature operable to facilitate projection of a sub-wavelength structure on the wafer during the lithography process; and
   the orthogonal PSW operable to create a sharper transition between the near-wavelength structure and the sub-wavelength structure.

15. The photomask of claim 9, further comprising:
   the first trench including a first depth; and
   the second trench including a second depth approximately half as deep as the first depth such that the orthogonal PSW creates a phase shift of approximately ninety degrees relative to the zero degree PSW.

16. The photomask of claim 9, further comprising:
the first trench including a first depth; and
the second trench including a second depth approximately fifty percent deeper than the first depth such that the orthogonal PSW creates a phase shift of approximately 270 degrees relative to the zero degree PSW.

17. The photomask of claim 9, wherein the orthogonal PSW comprises a square or a rectangle.

18. The photomask of claim 9, further comprising a pellicle assembly coupled to the substrate.

19. The photomask of claim 9, wherein the photomask comprises a chromeless photomask.

20. A photomask for improving printability of a structure on a wafer, comprising:
a patterned layer formed on at least a portion of a substrate;
a zero degree phase shift window (PSW) formed in the patterned layer to expose a top surface of the substrate;
a 180 degree PSW formed by a first trench in the substrate, the zero degree PSW and the 180 degree PSW cooperating to form a sub-wavelength feature;
a near-wavelength feature formed in the patterned layer adjacent the sub-wavelength feature; and
a ninety degree PSW formed by a second trench in the substrate between the zero degree PSW and the 180 degree PSW that extends into a portion of the sub-wavelength feature and a portion of the near-wavelength feature, the ninety degree PSW operable to facilitate projection of an increased intensity of radiant energy through the second region during a lithography process.

21. The photomask of claim 20, further comprising a pellicle assembly coupled to the substrate.

22. The photomask of claim 20, further comprising:
the first trench including a first depth; and
the second trench including a second depth approximately half as deep as the first depth.

23. The photomask of claim 20, further comprising:
the near-wavelength feature operable to facilitate projection of a near-wavelength structure on a wafer during the lithography process;
the sub-wavelength feature operable to facilitate projection of a sub-wavelength structure on the wafer during the lithography process; and
the ninety degree PSW operable to create a sharper transition between the near-wavelength structure and the sub-wavelength structure.

* * * * *